United States Patent
Nagaya et al.

(10) Patent No.: US 12,237,378 B2
(45) Date of Patent: Feb. 25, 2025

(54) METHOD FOR MANUFACTURING SiC SUBSTRATE

(71) Applicants: KWANSEI GAKUIN EDUCATIONAL FOUNDATION, Hyogo (JP); TOYOTA TSUSHO CORPORATION, Nagoya (JP)

(72) Inventors: Masatake Nagaya, Aichi (JP); Tadaaki Kaneko, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 291 days.

(21) Appl. No.: 17/632,727

(22) PCT Filed: Aug. 5, 2020

(86) PCT No.: PCT/JP2020/030067
§ 371 (c)(1),
(2) Date: Feb. 3, 2022

(87) PCT Pub. No.: WO2021/025077
PCT Pub. Date: Feb. 11, 2021

(65) Prior Publication Data
US 2022/0285502 A1    Sep. 8, 2022

(30) Foreign Application Priority Data
Aug. 6, 2019 (JP) ................. 2019-144449

(51) Int. Cl.
*H01L 21/306* (2006.01)
*H01L 21/02* (2006.01)
(Continued)

(52) U.S. Cl.
CPC .... *H01L 29/1608* (2013.01); *H01L 21/02378* (2013.01); *H01L 21/02529* (2013.01); *H01L 21/304* (2013.01); *H01L 21/30625* (2013.01)

(58) Field of Classification Search
CPC .................. H01L 21/30604; H01L 21/30625
See application file for complete search history.

(56) References Cited

U.S. PATENT DOCUMENTS

2013/0032822 A1    2/2013    Ishibashi
2015/0361585 A1*  12/2015    Aigo ............... H01L 21/02019
                                                        428/141

(Continued)

FOREIGN PATENT DOCUMENTS

JP    2008-16691 A     1/2008
JP    2008-230944 A   10/2008
(Continued)

OTHER PUBLICATIONS

English Translation of International Search Report from PCT/JP2020/030067 dated Oct. 20, 2020 (3 pages).
(Continued)

*Primary Examiner* — Thomas T Pham
(74) *Attorney, Agent, or Firm* — Calfee, Halter & Griswold LLP (57) ABSTRACT

An object to be solved by the present invention is to provide a new technology for producing a SiC substrate in which strain is removed and capable of achieving a flat surface as flat as a surface that has been subjected to CMP. The present invention, which solves the above object, is a method for producing a SiC substrate, the method including an etching step of etching a SiC substrate having arithmetic average roughness (Ra) of a surface of equal to or less than 100 nm in an atmosphere containing Si element and C element.

12 Claims, 5 Drawing Sheets

(51) Int. Cl.
*H01L 21/304* (2006.01)
*H01L 29/16* (2006.01)

(56) References Cited

U.S. PATENT DOCUMENTS

| | | | |
|---|---|---|---|
| 2016/0133465 A1 | 5/2016 | Sasaki | |
| 2017/0121848 A1* | 5/2017 | Torimi | .................... C30B 33/08 |
| 2017/0236905 A1 | 8/2017 | Torimi et al. | |
| 2017/0323797 A1 | 11/2017 | Torimi et al. | |
| 2019/0136409 A1 | 5/2019 | Kaneko et al. | |
| 2020/0255973 A1* | 8/2020 | Choi | ....................... C30B 29/36 |
| 2021/0301421 A1* | 9/2021 | Nagaya | ................... C30B 33/10 |
| 2021/0375613 A1* | 12/2021 | Yabuki | .............. H01L 21/02019 |

FOREIGN PATENT DOCUMENTS

| | | |
|---|---|---|
| JP | 2015-5702 A | 1/2015 |
| JP | 2017-65986 A | 4/2017 |
| JP | 2017-81813 A | 5/2017 |
| JP | 2018-158858 A | 10/2018 |
| WO | 2015/151413 A1 | 10/2015 |
| WO | 2016/079983 A1 | 5/2016 |
| WO | 2017/188381 A1 | 11/2017 |

OTHER PUBLICATIONS

E. Pernot et al., "SiC Single Crystal Sublimation Growth: Growth Parameters and Occurrence of Defects", translated by Shigehiro Nishino, FED Journal vol. 11, No. 2 (2000); p. 11-40.
EPO Communication and European Search Report issued in the corresponding EP application No. 20849859.2 dated Oct. 9, 2023 (8 pages).

* cited by examiner

METHOD FOR MANUFACTURING SiC SUBSTRATE

CROSS-REFERENCE TO RELATED APPLICATIONS

This application is a 371 of PCT Application No. PCT/JP2020/030067, filed on Aug. 5, 2020, which claims priority to Japanese Application No. 2019-144449, filed on Aug. 6, 2019, the contents of which are hereby incorporated by reference as if recited in their entirety.

TECHNICAL FIELD

The present invention relates to a method for producing a SiC substrate.

BACKGROUND ART

A silicon carbide (SiC) wafer is formed by slicing a SiC single crystal ingot. On the surface of the sliced SiC substrate, there is a surface layer (hereinafter, referred to as an subsurface damaged layer) having strain and scratches of a crystal introduced at the time of slicing. In order not to reduce the yield in the device production step, it is necessary to remove this subsurface damaged layer.

In a conventional technology, machining is performed in order to remove this subsurface damaged layer and obtain an epi-ready SiC substrate capable of epitaxial growth for producing a SiC device. In general, this machining includes a rough grinding step using abrasive grains such as diamond, a finish grinding step using abrasive grains with a smaller grain size than the abrasive grains used in the rough grinding step, and a chemical mechanical polishing (CMP) step of performing polishing by using both a mechanical action of a polishing pad and a chemical action of slurry (for example, Patent Literature 1).

CITATION LIST

Patent Literature

Patent Literature 1: JP 2015-5702 A

SUMMARY OF INVENTION

Technical Problem

In conventional technologies, in general, chemical mechanical polishing (CMP) is performed in order to obtain a SiC substrate having an epi-ready surface. However, there is a problem that the cost related to CMP is high. There is also a problem that strain is newly introduced by CMP.

In view of the above problems, an object to be solved by the present invention is to provide a new technology for producing a SiC substrate in which strain is removed and capable of achieving a flat surface as flat as a surface that has been subjected to CMP.

Solution to Problem

The present invention, which solves the above object, is a method for producing a SiC substrate, the method including an etching step of etching a SiC substrate having arithmetic average roughness (Ra) of a surface of equal to or less than 100 nm in an atmosphere containing Si element and C element.

By etching a SiC substrate having arithmetic average roughness (Ra) of a surface of equal to or less than 100 nm in an atmosphere containing Si element and C element, it is possible to produce a SiC substrate in which strain is removed and having extremely smooth (smooth without unevenness) surface.

A preferred mode of the present invention includes an etching step of etching a SiC substrate having arithmetic average roughness (Ra) of a surface of equal to or less than 2 nm in an atmosphere containing Si element and C element.

By etching a SiC substrate having arithmetic average roughness (Ra) of a surface of equal to or less than 2 nm in an atmosphere containing Si element and C element, it is possible to produce a SiC substrate having a smoother surface.

The present invention also relates to a method for producing a SiC substrate, the method including: a planarization step of planarizing a surface of a SiC substrate so that arithmetic average roughness (Ra) is equal to or less than 100 nm; and an etching step of etching the SiC substrate after the planarization step in an atmosphere containing Si element and C element.

By etching a SiC substrate having arithmetic average roughness (Ra) of a surface of equal to or less than 100 nm in an atmosphere containing Si element and C element, it is possible to produce a SiC substrate in which strain is removed and having extremely smooth surface.

In a preferred mode of the present invention, in the planarization step, the surface of the SiC substrate is flattened so that the arithmetic average roughness (Ra) is equal to or less than 2 nm.

By etching a SiC substrate having arithmetic average roughness (Ra) of a surface of equal to or less than 2 nm in an atmosphere containing Si element and C element, it is possible to produce a SiC substrate having a smoother surface.

The present invention also relates to a method for producing a SiC substrate, the method including: a planarization step of planarizing a surface of a SiC substrate by using an abrasive grain having an average abrasive grain size of equal to or less than 10 μm; and an etching step of etching the SiC substrate after the planarization step in an atmosphere containing Si element and C element.

By etching a SiC substrate that has been flattened by using an abrasive grain having an average abrasive grain size of equal to or less than 10 μm in an atmosphere containing Si element and C element, it is possible to produce a SiC substrate in which strain is removed and having extremely smooth surface.

In a preferred mode of the present invention, the average abrasive grain size of the abrasive grain is equal to or less than 0.5 μm.

By etching a SiC substrate that has been flattened by using an abrasive grain having an average abrasive grain size of equal to or less than 0.5 μm in an atmosphere containing Si element and C element, it is possible to obtain a SiC substrate having a smoother surface.

In a preferred mode of the present invention, the etching step includes a step of arranging a SiC substrate and a SiC material so as to face each other, and performing heating so as to form a temperature gradient between the SiC substrate and the SiC material to etch the SiC substrate.

In a preferred mode of the present invention, the etching step includes a step of arranging and heating a SiC substrate in which a crack is introduced in a semi-closed space having an atomic number ratio of Si/C of equal to or less than 1.

In the preferred mode of the present invention, a surface of the SiC substrate is not machined after the etching step.

In the preferred mode of the present invention, a cleaning step of cleaning a surface of the SiC substrate with a liquid agent is not performed after the etching step.

In a preferred mode of the present invention, an epitaxial growth step of forming an epi layer on a surface of the SiC substrate is performed after the etching step.

In a preferred mode of the present invention, the etching step is a step of etching a SiC single crystal seed substrate to produce a SiC single crystal seed substrate, and the method further includes an ingot forming step of performing crystal growth of the SiC single crystal seed substrate to obtain an ingot, after the etching step.

As described above, the present invention can be applied to the production of SiC ingots.

In a preferred mode of the present invention, the SiC substrate is equal to or greater than two inches.

Advantageous Effects of Invention

According to the disclosed technology, it is possible to produce a SiC substrate in which strain is removed and having an extremely smooth surface.

According to the present invention, it is possible to reduce the costly step of chemical mechanical polishing (CMP), and it is possible to manufacture a SiC device in an industrially advantageous manner.

Other issues, features and advantages will become apparent by reading the description of embodiments described below as taken up with the drawings and the claims.

DESCRIPTION OF EMBODIMENTS

The present invention is a method for producing a SiC substrate. The term "SiC substrate" as used herein broadly includes, in addition to a so-called "SiC wafer" after being cut out from an ingot, a "SiC single crystal seed substrate" used for producing a SiC ingot, and a "SiC single crystal basesubstrate" which is a SiC single crystal substrate in a state before a "SiC single crystal seed substrate" to be used in an ingot forming step.

The present invention will be described below separately for an embodiment for producing a "SiC wafer" and an embodiment for producing a "SiC single crystal seed substrate".

[Production Method of SiC Wafer]

A method for producing a SiC wafer of the present invention will be described in more detail with reference to FIG. 1. The drawing illustrates a preferred embodiment. However, the method can be performed in many different embodiments and is not limited to the embodiments described herein.

In understanding the present invention, it is recognized that it is useful to compare with a conventional production step of a SiC wafer. Therefore, each step in the method for producing a SiC wafer of the present invention will be described with reference to FIG. 11 as appropriate, while comparing with each step in the conventional method for producing a SiC wafer.

For SiC single crystals, which are the base of SiC semiconductors, ingots, which are lumps of crystals, are artificially made by sublimating raw materials at a high temperature of equal to or higher than 2000° C. The material properties of SiC single crystals are considered to be the second hardest after diamond and boron carbide, and SiC single crystals have high hardness, chemical and thermal stability enough to be used as abrasives, and have crystal orientation and direction. Therefore, SiC single crystals are materials that are extremely difficult to process having the cleavage peculiar to fragile (brittle) materials.

In conventional methods, in order to form a semiconductor on the surface of the material, a planarization step S20 is performed after cutting out a SiC wafer from a single crystal ingot by a slicing step S1. In conventional methods, as the planarization step S20, typically, a lapping step S21 for planarizing waviness, a rough grinding step S22 and a finish grinding step S23 for removing the subsurface damaged layer 11 are performed (FIG. 11).

Figure 11:
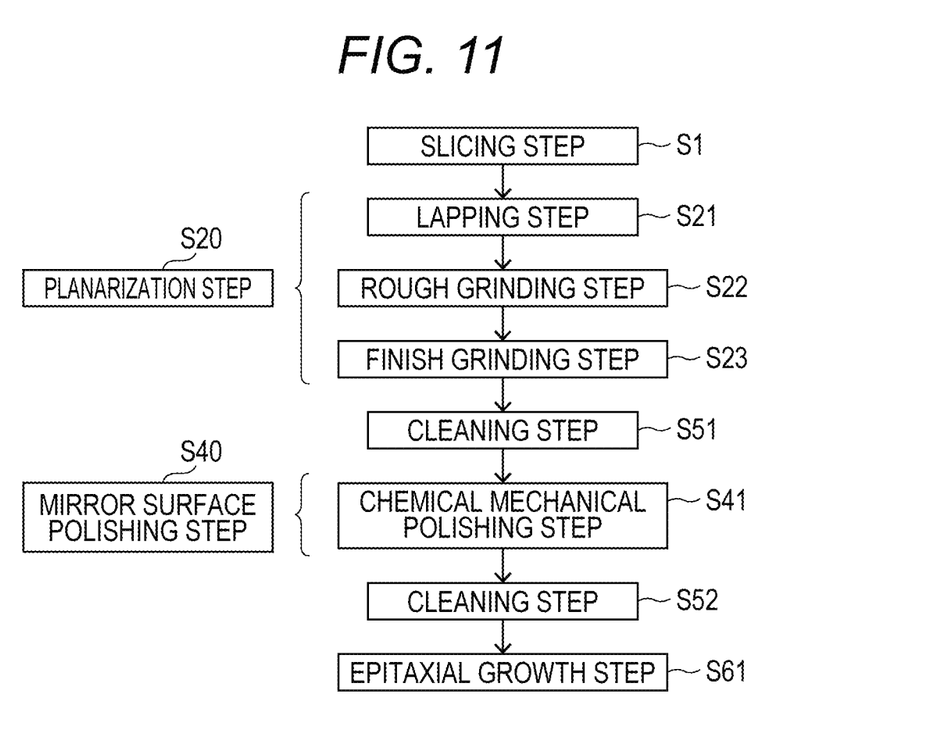
FIG. 11 is an explanatory diagram illustrating a conventional production step of a SiC substrate.

In general, the SiC wafer that has been subjected to the planarization step S20 is then subjected to a chemical mechanical polishing step S41, that is, chemical mechanical polishing (CMP), which can finally achieve strain-free processing (FIG. 11).

Figure 1:
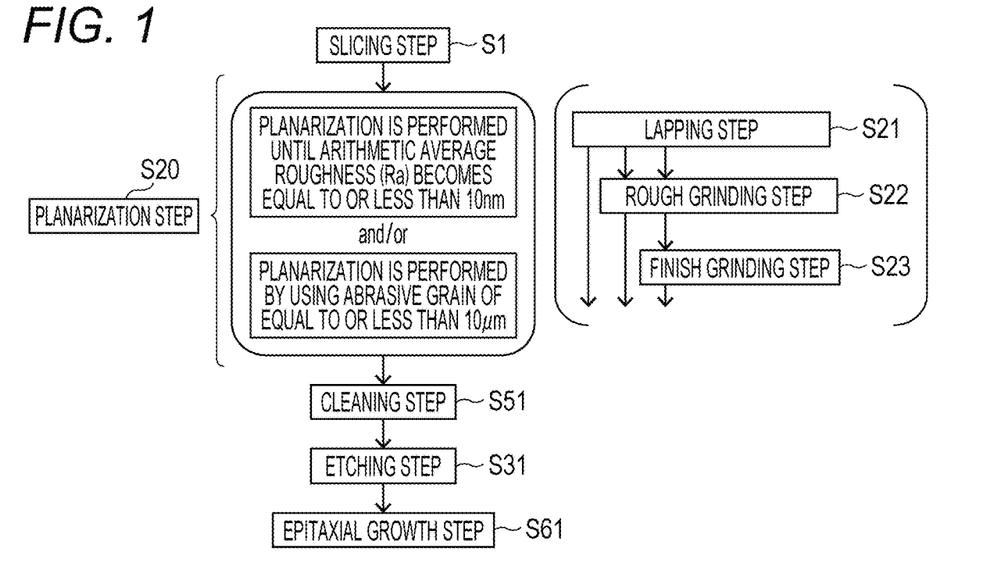
FIG. 1 is a schematic diagram illustrating a production step of a SiC substrate of an embodiment.

FIG. 1 illustrates an outline of the method for producing a SiC wafer of the present invention. As illustrated in FIG.

1, in the method for producing a SiC wafer of the present invention, after the planarization step is performed until a predetermined surface roughness is obtained, or after a planarization step is performed using an abrasive grain having a predetermined grain size or less, an etching step S31 is performed.

Since such a configuration is adopted, it is not necessary to perform all the series of steps of the lapping step S21, the rough grinding step S22, and the finish grinding step S23 in the present invention (right side in FIG. 1).

For example, if a SiC wafer having a predetermined surface roughness can be obtained by the lapping step S21, then the etching step S31 may be performed without performing the rough grinding step S22 and the finish grinding step S23.

Of course, the etching step S31 may be performed after all the series of steps of the lapping step S21, the rough grinding step S22, and the finish grinding step S23 are performed.

Regardless of the type of processing step performed on the SiC wafer, the etching step S31 may be simply performed on the SiC wafer having a predetermined surface roughness.

The SiC substrate to which the present invention can be applied includes, without limitation, those having an off-angle and those having no off-angle.

The present invention can be applied without limitation regardless of whether the SiC substrate is a polymorph of crystals such as 4H-SiC, 6H-SiC, and 3C-SiC.

A main surface (the surface to be processed) of the SiC substrate to which the present invention is applied may be a Si surface (0001) surface or a C surface (000-1) surface.

Figure 12:
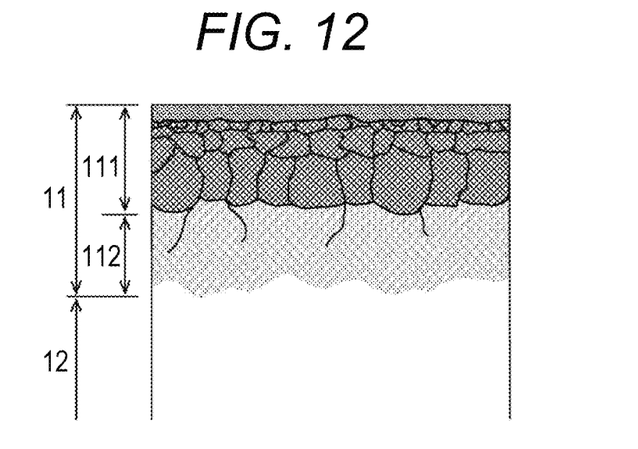
FIG. 12 is a conceptual diagram when a surface of a SiC substrate that has been subjected to general machining is observed from a cross section.

FIG. 12 is a conceptual diagram when a surface of a machined wafer is observed from a cross section. In general, on the surface of the SiC wafer 10 that has been subjected to machining as in the conventional method, an subsurface damaged layer 11 including a crack layer 111 having a large number of cracks (scratches) and a strain layer 112 in which strain is generated in a crystal lattice remain.

In order not to reduce the yield in the device production step, it is necessary to remove this subsurface damaged layer 11. That is, it is preferable to expose a bulk layer 12 under the subsurface damaged layer 11 in which cracks and lattice strain due to surface processing are not introduced.

According to the method for producing a SiC wafer of the present invention, the bulk layer 12 to which cracks and lattice strain have not been introduced can be exposed by removing the subsurface damaged layer 11 by thermal etching.

Hereinafter, the method for producing a SiC wafer of the present invention will be described according to the steps of one embodiment.

<1> Slicing Step S1

The slicing step S1 is a step of cutting out a SiC wafer from a SiC ingot. Examples of slicing means of the slicing step S1 include a multi-wire saw cutting of cutting the ingot at predetermined intervals by reciprocating a plurality of wires, an electric discharge machining method of cutting by intermittently generating a plasma discharge, and cutting using a laser that emits and condenses a laser beam in the ingot to form a layer serving as a base point for cutting.

<2> Planarization Step S20

As illustrated in FIG. 1, the planarization step S20 in the present invention includes an aspect of planarization to a predetermined roughness or less and an aspect of planarization using an abrasive grain having a predetermined grain size or less. These aspects are correlated with each other.

First, description will be given about a mode of planarization using an abrasive grain.

(1) Mode of Planarization Using Abrasive Grain

Examples of the abrasive grain include diamond, boron carbide ($B_4C$), silicon carbide (SiC), and alumina ($Al_2O_3$).

Examples of planarization means of the planarization step S20 include a loose abrasive grain method (lapping polishing or the like) of processing while pouring fine abrasive grains on a surface plate, or a fixed abrasive grain method of processing with an abrasive stone with abrasive grains embedded in a bond material (grind grinding or the like).

Examples of a case of the fixed abrasive grain method is adopted include rough grinding and finish grinding using a diamond abrasive grain.

When the loose abrasive grain method is adopted, it is desirable that the abrasive grain is dropped as a mixed liquid (slurry) mixed with water or a dispersant.

As the processing apparatus used in this step, a general-purpose processing apparatus used in a conventional loose abrasive grain method can be adopted.

The average abrasive grain size of the abrasive grain used in the planarization step S20 is preferably equal to or less than 10 μm, more preferably equal to or less than 9 μm, more preferably equal to or less than 8 μm, more preferably equal to or less than 7 μm, more preferably equal to or less than 6 μm, and more preferably equal to or less than 5 μm, more preferably equal to or less than 4 μm, more preferably equal to or less than 3 μm, still more preferably equal to or less than 2 μm, still more preferably equal to or less than 1 μm, still more preferably equal to or less than 0.8 μm, still more preferably equal to or less than 0.6 μm, still more preferably equal to or less than 0.5 μm, still more preferably equal to or less than 0.4 μm, and still more preferably equal to or less than 0.3 μm.

By performing the planarization step S320 using the abrasive grain having the average abrasive grain size in the above numerical range and performing the etching step S31, it is possible to obtain a SiC wafer having a surface in which strain is removed and that is as flat as the surface that has been subjected to the chemical mechanical polishing step S41.

In particular, by performing the planarization step S20 using an abrasive grain having an average abrasive grain size of equal to or less than 0.5 μm and performing the etching step S31, a SiC wafer having an extremely flat surface can be produced. Such an embodiment is also applicable to mass production processes.

There is no limit for the size of the SiC substrate to which the present invention can be applied. The present invention can be applied to a SiC substrate of preferably equal to or greater than two inches, more preferably equal to or greater than four inches.

When the surface of a SiC wafer is ground and flattened using an abrasive grain, there is a problem that the flatness varies depending on the grinding position on the same wafer. This problem is remarkable, for example, when planarizing a SiC wafer having a large diameter of equal to or greater than six inches.

According to the SiC wafer of the present invention, by the etching step S31 in the succeeding step, the variation in flatness caused by the planarization step S20 using an abrasive grain can be corrected.

That is, the present invention is preferable when processing a SiC wafer having a large diameter of equal to or greater than six inches, more preferably equal to or greater than eight inches.

In the description in this specification, the average abrasive grain size means the average grain size according to Japanese Industrial Standards (JIS) R6001-2: 2017.

(2) Mode of Performing Planarization Until Surface Becomes Predetermined Rough or Less In the planarization step S20, the planarization step S20 is performed so that the arithmetic average roughness (Ra) is preferably equal to or less than 100 nm, more preferably equal to or less than 90 nm, more preferably equal to or less than 80 nm, more preferably equal to or less than 70 nm, more preferably equal to or less than 60 nm, more preferably equal to or less than 50 nm, more preferably equal to or less than 45 nm, more preferably equal to or less than 40 nm, more preferably equal to or less than 35 nm, more preferably equal to or less than 30 nm, more preferably equal to or less than 25 nm, more preferably equal to or less than 20 nm, more preferably equal to or less than 18 nm, more preferably equal to or less than 15 nm, more preferably equal to or less than 12 nm, more preferably equal to or less than 10 nm, more preferably equal to or less than 9 nm, more preferably equal to or less than 8 nm, more preferably equal to or less than 7 nm, more preferably equal to or less than 6 nm, more preferably equal to or less than 5 nm, more preferably equal to or less than 4 nm, more preferably equal to or less than 3 nm, still more preferably equal to or less than 2 nm, still more preferably equal to or less than 1.5 nm, and still more preferably equal to or less than 1 nm.

By performing the planarization step S20 as to achieve the surface roughness in the above numerical range and performing the etching step S31, it is possible to obtain a SiC wafer having a surface in which strain is removed and that is as flat as the surface that has been subjected to the chemical mechanical polishing step S41.

In particular, by performing the planarization step S20 so that the arithmetic average roughness (Ra) is 2 nm or less and performing the etching step S31, a SiC wafer having an extremely flat surface can be manufactured. Such an embodiment is also applicable to mass production processes.

In the description of the present specification, the arithmetic average roughness (Ra) is arithmetic average roughness based on Japanese Industrial Standards (JIS) B0601-2001. The arithmetic average roughness (Ra) of the surface of the SiC substrate can be measured by an atomic force microscope (AFM) or a laser microscope.

In the present specification, the term "arithmetic average roughness (Ra)" as used in this specification refers to the arithmetic average roughness (Ra) measured by AFM.

In the planarization step S20, as a means for achieving the surface roughness in the above numerical range on the surface of the SiC wafer, preferably, the above-mentioned method using an abrasive grain having a predetermined average abrasive grain size can be mentioned.

In addition to the mode using an abrasive grain, the planarization step S20 may be performed by various types of etching. Preferable examples of the planarization step S20 by etching include Si vapor pressure etching.

<3> Cleaning Step S51

As illustrated in FIG. 1, it is preferable to perform the cleaning step S51 after the planarization step S20. By removing organic matter contamination and particle contamination, removing an oxide layer, removing ion contamination, and the like by the cleaning step S51 before the etching step S31, it is possible to suppress the occurrence of abnormal etching, and contamination in the etching furnace can be prevented.

Examples of a specific method of the cleaning step S51 include RCA cleaning.

<4> Etching Step S31

The etching step S31 is a step of etching the SiC wafer that has been subjected to the above-mentioned planarization step S20.

A SiC wafer that has not been subjected to the planarization step S20 but has a surface roughness in the above-mentioned numerical range may be subjected to the etching step S31. For example, when the surface roughness of the SiC wafer obtained by the slicing step S1 is within the above-mentioned numerical range, the etching step S31 may be performed after the slicing step S1 without the planarization step S20.

The etching step S31 is a step of etching a SiC wafer in an atmosphere containing Si element and C element.

More specifically, the etching step S31 is a step of arranging the SiC wafer 10 and the SiC material so as to face each other, performing heating, and transporting the Si element and the C element from the SiC wafer 10 to the SiC material to etch the SiC wafer 10.

The SiC material is composed of SiC that can receive Si element and C element from the SiC wafer 10 by heating the SiC material so as to face the SiC wafer 10. Examples include a container made of SiC and a substrate made of SiC (SiC member). As the crystal polymorph of SiC material, any polytype can be adopted, and polycrystalline SiC may be adopted.

As a preferred embodiment, a mode in which the main container 20 capable of accommodating the SiC wafer 10 and configured to act as a SiC material by itself will be described below.

First, an apparatus configuration capable of achieving the etching step S31 will be described.

Figure 2:
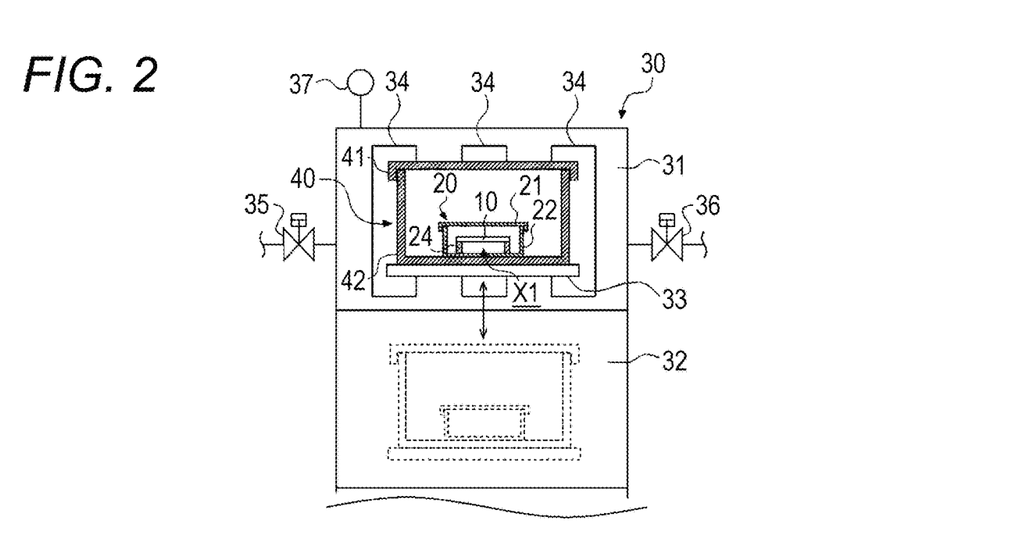
FIG. 2 is an explanatory diagram of a SiC substrate production apparatus of an embodiment.

As illustrated in FIG. 2, the etching apparatus for the etching step S31 includes: a main container 20 that can accommodate the SiC wafer 10, and generates a vapor pressure of a gas phase species containing Si element and a gas phase species containing C element in an internal space by heating; and a heating furnace 30 that accommodates the main container 20, generates the vapor pressure of the gas phase species containing Si element in the internal space, and performs heating so as to form a temperature gradient.

The main container 20 has an etching space X1 formed by causing a part of the main container 20 arranged on the low temperature side of the temperature gradient and the SiC wafer 10 face each other in a state where the SiC wafer 10 is arranged on the high temperature side of the temperature gradient.

In the description in the present specification, the surface of the SiC wafer 10 on which the semiconductor element will be formed (specifically, the surface on which the epitaxial layer will be deposited) is referred to as a main surface 101, and the surface facing the main surface 101 is referred to as a rear surface 102. The main surface 101 and the rear surface 102 are collectively referred to as a front surface, and the direction of penetrating the main surface 101 and the rear surface 102 is referred to as a front and back direction.

Examples of the main surface 101 include a surface having an off angle of several degrees (for example, 0.4 to 8°) from the (0001) surface or the (000-1) surface. (In this specification, in the notation of the Miller index, "-" means the bar attached to the index immediately after that).

It is sufficient that the main container 20 has a configuration in which the SiC wafer 10 can be accommodated, and a vapor pressure of the gas phase species containing the Si element and the gas phase species containing the C element is generated in the internal space at the time of the heat treatment of the main container 20. For example, the main container 20 is made of a material containing polycrystalline SiC. In the present embodiment, the entire main container 20 is made of polycrystalline SiC. By heating the main container 20 made of such a material, the vapor pressure of the gas phase species containing Si element and the gas phase species containing C element can be generated.

That is, it is desirable that the environment inside the heat-treated main container 20 is a vapor pressure environment of a mixed system of gas phase species containing Si element and gas phase species containing C element. Examples of the gas phase species containing the Si element include Si, $Si_2$, $Si_3$, $Si_2C$, $SiC_2$, and SiC. Examples of the gas phase species containing the C element include $Si_2C$, $SiC_2$, SiC, and C. That is, the SiC gas exists in the main container 20.

A configuration can be adopted as long as the configuration generates a vapor pressure of the gas phase species containing the Si element and the gas phase species containing the C element in the internal space at the time of the heat treatment of the main container 20. For example, a configuration in which the polycrystalline SiC is exposed on a part of the inner surface, or a configuration in which the polycrystalline SiC is separately arranged in the main container 20 can be noted.

Figure 3:
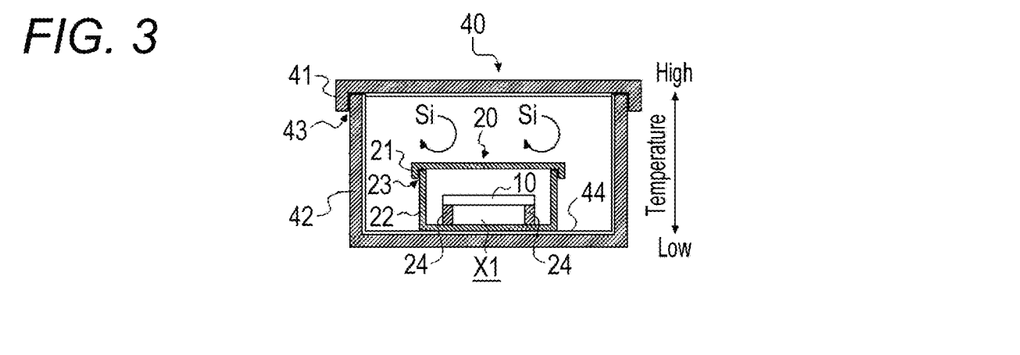
FIG. 3 is a schematic diagram of a main container and a refractory container of an embodiment.

As illustrated in FIG. 3, the main container 20 is a fitting container including an upper container 21 and a lower container 22 that can be fitted to each other. A minute gap 23 is formed in a fitting portion between the upper container 21 and the lower container 22, and the main container 20 is configured so that air exhausting (evacuation) in the main container 20 can be performed from this gap 23.

With such a configuration, it is preferable that a semi-closed space is formed inside the main container 20. The "semi-closed space" in the present specification refers to a space in which at least part of steam generated in the container can be confined, although the inside of the container can be evacuated.

The main container 20 has an etching space X1 formed by causing a part of the main container 20 arranged on the low temperature side of the temperature gradient and the SiC wafer 10 face each other in a state where the SiC wafer 10 is arranged on the high temperature side of the temperature gradient. That is, at least a part of the main container 20 (for example, the bottom surface of the lower container 22) has a temperature lower than that of the SiC wafer 10 due to the temperature gradient provided in the heating furnace 30, and thereby, an etching space X1 is formed.

The etching space X1 is a space for transporting the Si atom and the C atom on the surface of the SiC wafer 10 to the main container 20 by using a temperature difference provided between the SiC wafer 10 and the main container 20 as a driving force.

Figure 4:
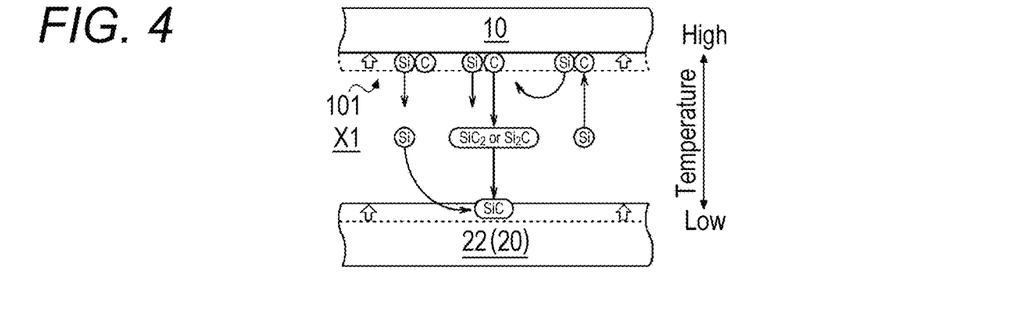
FIG. 4 is an explanatory diagram illustrating an outline of etching in an etching step.

For example, the SiC wafer 10 is arranged so that, when the temperature on the main surface 101 (or the rear surface 102) of the SiC wafer 10 and the temperature on the bottom surface of the lower container 22 facing the main surface 101 are compared, the temperature on the side of the main surface 101 is higher and the temperature on the side of the bottom surface of the lower container 22 is lower (see FIG. 4). As described above, by forming a space (etching space X1) with a temperature difference between the main surface 101 and the bottom surface of the lower container 22, the Si atom and C atom of the main surface 101 can be transported to the bottom surface of the lower container 22 by using the temperature difference as a driving force.

The main container 20 may have a substrate holder 24 provided between the SiC wafer 10 and the main container 20.

The heating furnace 30 according to the present embodiment has a configuration of performing heating so as to form a temperature gradient such that the temperature decreases from the upper container 21 to the lower container 22 of the main container 20. Therefore, the substrate holder 24 capable of holding the SiC wafer 10 can be provided between the SiC wafer 10 and the lower container 22 to form the etching space X1 between the SiC wafer 10 and the lower container 22.

It is sufficient that the substrate holder 24 has a configuration in which at least a part of the SiC wafer 10 can be held in a hollow of the main container 20. For example, any conventional support means such as one-point support, three-point support, a configuration for supporting the outer peripheral edge, or a configuration for sandwiching a part thereof can be naturally adopted. As the material of the substrate holder 24, a SiC material or a high melting pointmetal material can be adopted.

The substrate holder 24 may not be provided depending on the direction of the temperature gradient of the heating furnace 30. For example, when the heating furnace 30 forms a temperature gradient so that the temperature decreases from the lower container 22 toward the upper container 21, the SiC wafer 10 may be arranged on the bottom surface of the lower container 22 (without providing the substrate holder 24).

As illustrated in FIG. 2, the heating furnace 30 includes: a main heating chamber 31 capable of heating an object to be treated (SiC wafer 10 or the like) to a temperature of equal to or higher than 1000° C. and equal to or less than 2300° C.; a preheating chamber 32 capable of preheating the object to be treated to a temperature of equal to or higher than 500° C.; a refractory container 40 capable of accommodating the main container 20; and moving means 33 (moving table) capable of moving the refractory container 40 from the preheating chamber 32 to the main heating chamber 31.

The main heating chamber 31 is formed in a regular hexagonal shape in a plan sectional view, and the refractory container 40 is arranged inside the heating chamber 31.

A heater 34 (mesh heater) is provided inside the main heating chamber 31. A multilayer heat-reflecting metal plate is fixed to a side wall and ceiling of the main heating chamber 31 (not illustrated). This multilayer heat-reflecting metal plate is configured to reflect the heat of the heater 34 toward a substantially central portion of the main heating chamber 31.

As a result, in the main heating chamber 31, the heater 34 is arranged so as to surround the refractory container 40 accommodating the object to be treated, and further, the multilayer heat-reflecting metal plate is arranged outside the heater 34, so that the temperature can be raised to equal to or higher than 1000° C. and equal to or less than 2300° C.

As the heater 34, for example, a resistance heating type heater or a high frequency induction heating type heater can be used.

As a configuration of the heater 34, a configuration capable of forming a temperature gradient in the refractory container 40 may be adopted. For example, the heater 34 may be configured so that many heaters are arranged on the upper side (or the lower side). Further, the heater 34 may be configured so that the width increases toward the upper side (or the lower side). Alternatively, the heater 34 may be configured so that the electric power supplied can be increased toward the upper side (or the lower side).

To the main heating chamber 31, a vacuum forming valve 35 that performs air exhausting in the main heating chamber 31, an inert gas injection valve 36 that introduces an inert gas into the main heating chamber 31, a vacuum gauge 37 that measures the degree of vacuum in the main heating chamber 31 are connected.

The vacuum forming valve 35 is connected to an evacuation pump that exhausts and evacuates the inside of the main heating chamber 31 (not illustrated). With the vacuum forming valve 35 and the evacuation pump, the degree of vacuum in the main heating chamber 31 can be adjusted to, for example, equal to or less than 10 Pa, more preferably equal to or less than 1 Pa, still more preferably equal to or less than $10^{-3}$ Pa. Examples of this evacuation pump include a turbomolecular pump.

The inert gas injection valve 36 is connected to an inert gas supply source (not illustrated). With the inert gas injection valve 36 and the inert gas supply source, inert gas can be introduced into the main heating chamber 31 in the range of $10^{-5}$ to 10000 Pa. As this inert gas, Ar, He, $N_2$ and the like can be selected.

The preheating chamber 32 is connected to the main heating chamber 31, and is configured so the refractory container 40 can be moved by the moving means 33. The preheating chamber 32 of the present embodiment is configured so that the temperature can be raised by the residual heat of the heater 34 of the main heating chamber 31. For example, when the temperature of the main heating chamber 31 is raised to 2000° C., the temperature of the preheating chamber 32 is raised to about 1000° C., and the object to be treated (SiC wafer 10, main container 20, refractory container 40, or the like) can be degassed.

The moving means 33 is configured to be movable between the main heating chamber 31 and the preheating chamber 32 on which the refractory container 40 is placed. Since the transportation between the main heating chamber 31 and the preheating chamber 32 by the moving means 33 is completed in about one minute at the shortest, it is possible to raise or lower the temperature at 1 to 1000° C./min.

As described above, since the temperature can rapidly raises and lowered, it is possible to observe a surface shape that does not have a history of low-temperature growth during raising and lowering, which is difficult with conventional apparatuses.

In FIG. 2, the preheating chamber 32 is arranged below the main heating chamber 31, but the present invention is not limited to this, and the preheating chamber 32 may be arranged in any direction.

The moving means 33 according to the present embodiment is a moving table on which the refractory container 40 is placed. A small amount of heat is released from the contact portion between the moving table and the high melting point 40. As a result, a temperature gradient can be formed in the refractory container 40.

In the heating furnace 30 of the present embodiment, since the bottom of the refractory container 40 is in contact with the moving table, a temperature gradient is provided so that the temperature decreases from the upper container 41 to the lower container 42 of the refractory container 40.

The direction of this temperature gradient can be set to any direction by changing the position of the contact portion between the moving table and the refractory container 40. For example, when a hanging type or the like is adopted for the moving table and the contact portion is provided on the ceiling of the refractory container 40, heat escapes upward. Therefore, the temperature gradient is provided so that the temperature rises from the upper container 41 to the lower container 42 of the refractory container 40. It is desirable that this temperature gradient is formed along the front and back direction of the SiC wafer 10.

As described above, a temperature gradient may be formed depending on the configuration of the heater 34.

The vapor pressure environment of the gas phase species containing the Si element in the heating furnace 30 according to the present embodiment is formed by using the refractory container 40 and the Si vapor supply source 44. For example, any method capable of forming an environment of a vapor pressure of gas phase species containing a Si element around the main container 20 can be adopted in the etching apparatus.

The refractory container 40 includes a high melting point material. Examples of such refractory material include C that is a general-purpose heat-resistant member, W, Re, Os, Ta, and Mo that are high melting point metals, $Ta_9C_8$, HfC, TaC, NbC, ZrC, $Ta_2C$, TiC, WC, and MoC that are carbides, HfN, TaN, BN, $Ta_2N$, ZrN, and TiN that are nitrides, and $HfB_2$, $TaB_2$, $ZrB_2$, $NB_2$, $TiB_2$, and polycrystalline SiC that are borides.

As similar to the main container 20, the refractory container 40 is a fitting container including an upper container 41 and a lower container 42 that can be fitted to each other, and is configured to be able to accommodate the main container 20. A minute gap 43 is formed in the fitting portion between the upper container 41 and the lower container 42, and is configured so that air exhausting (evacuation) in the refractory container 40 from this gap 43.

The refractory container 40 has a Si vapor supply source 44 capable of supplying a vapor pressure of gas phase species containing a Si element in the refractory container 40. The Si vapor supply source 44 may be configured to generate Si vapor in the refractory container 40 during heat treatment, and examples thereof include solid Si (a single crystal Si piece or a Si pellet of Si powder or the like) and a Si compound.

In the etching apparatus, TaC is used as the material of the refractory container 40, and tantalum silicide is used as the Si vapor supply source 44. That is, as illustrated in FIG. 3, a tantalum silicide layer is formed inside the refractory container 40, and a configuration is adopted in which a vapor pressure of a gas phase species containing Si element is supplied from the tantalum silicide layer into the container during heat treatment, thereby forming the Si vapor pressure environment.

In addition to this, any configuration can be adopted as long as a vapor pressure of a gas phase species containing Si element is formed in the refractory container 40 during heat treatment.

The etching apparatus described above includes: the main container 20 that accommodates the SiC wafer 10 and generates a vapor pressure of a gas phase species containing Si element and a gas phase species containing C element in an internal space by heating; and a heating furnace 30 that accommodates the main container 20, generates a vapor pressure of a gas phase species containing Si element in an internal space, and performs heating so as to form a temperature gradient, and the main container 20 has a configuration including an etching space X1 formed by causing a part of the main container 20 arranged on a low temperature side of the temperature gradient and the SiC wafer 10 to face each other in a state where the SiC wafer is arranged on a high temperature side of the temperature gradient.

With such a configuration, a near thermal equilibrium state can be formed between the SiC wafer 10 and the main container 20, and a vapor pressure environment of a gas phase species containing Si element and a gas phase species containing C element in the main container 20 (partial pressure of gas phase species such as Si, $Si_2$, $Si_3$, $Si_2C$, $SiC_2$, SiC) can be formed. In such an environment, mass transportation occurs by using the temperature gradient of the heating furnace 30 as a driving force, and as a result, the SiC wafer 10 is etched and flattened.

By heating the main container 20 in a vapor pressure environment of gas phase species containing a Si element (for example, a Si vapor pressure environment), it is possible to suppress the exhaust of gas phase species containing the Si element from the main container 20. That is, the environment inside the main container 20 can be maintained by balancing the vapor pressure of the gas phase species containing the Si element inside the main container 20 and the vapor pressure of the gas phase species containing the Si element outside the main container 20.

The above-described etching apparatus, the main container 20 is composed of polycrystalline SiC. With such a configuration, when the main container 20 is heated by using the heating furnace 30, only a vapor pressure of a gas phase species containing a Si element and a gas phase species containing C element can be generated in the main container 20.

As illustrated in FIGS. 3 and 4, in the etching step S31 according to the present embodiment, the SiC wafer 10 is etched by accommodating the SiC wafer 10 in the inside of the main container 20 that generates a vapor pressure of a gas phase species containing Si element and a gas phase species containing C element in an internal space, and heating the main container 20 so as to form a temperature gradient in an environment of a vapor pressure of a gas phase species containing Si element.

FIG. 4 is an explanatory diagram illustrating an outline of an etching mechanism. It is considered that, by heating the main container 20 in which the SiC wafer 10 is arranged in a temperature range of 1400° C. or higher and 2300° C. or lower, the reactions 1) to 5) below are performed continuously, and as a result, the etching proceeds.

Explanation of 1): When the SiC wafer 10 (SiC(s)) is heated, Si atoms (Si(v)) are desorbed from the surface of the SiC wafer 10 by thermal decomposition (Si atom sublimation step).

Explanation of 2) and 3): When C (C(s)) remaining on the surface of the SiC wafer 10 due to the desorption of Si atoms (Si(v)) reacts with the Si vapor (Si(v)) in the main container 20 to be sublimated from the surface of the SiC wafer 10 as $Si_2C$, $SiC_2$ or the like (C atom sublimation step).

Explanation of 4) and 5): Sublimated $Si_2C$, $SiC_2$, or the like reach the bottom surface (polycrystalline SiC) in the main container 20 and grow due to the temperature gradient.

That is, the etching step S31 includes: a Si atom sublimation step of thermally sublimating the Si atom from the surface of the SiC wafer 10; and a C atom sublimation step of causing the C atom remaining on the surface of the SiC wafer 10 to react with the Si vapor in the main container 20 to sublimate the C atom from the surface of the SiC wafer 10.

The etching step S31 may be performed in a state where a Si element supply source or a C element supply source other than the SiC wafer 10 is arranged in the inside of the main container 20. There is no particular problem even if a Si element supply source/C element supply source other than the SiC wafer 10 exists.

When the SiC wafer 10 has a crack (crack layer 111), it is preferable to arrange the SiC wafer 10 in a semi-closed space having an atomic number ratio Si/C of equal to or less than 1 and perform heating. For example, the SiC wafer 10 satisfying a stoichiometric ratio 1:1 and a SiC material satisfying a stoichiometric ratio 1:1 are arranged in a container (main container 20) made of SiC satisfying a stoichiometric ratio 1:1, the atomic number ratio Si/C in the main container 20 is 1. A C vapor supply source (C pellet or the like) may be arranged to set the atomic number ratio Si/C to equal to or less than 1.

By etching the SiC wafer 10 in such an environment, a crack (crack layer 111) can be removed at high speed.

The presence/absence and depth of the crack and the crack layer 111 have a correlation with the arithmetic average roughness (Ra). That is, the arithmetic average roughness (Ra) value of the surface of the SiC wafer 10 having a crack is equal to or greater than 10 nm, or equal to or greater than 15 nm, or equal to or greater than 20 nm, or equal to or greater than 25 nm, or equal to or greater than 30 nm, or equal to or greater than 35 nm, or equal to or greater than 40 nm.

In the etching step S31, the SiC wafer 10 arranged on the high temperature side of the temperature gradient and a part of the main container 20 arranged on the low temperature side of the temperature gradient are etched so as to face each other.

That is, by arranging the main surface 101 of the SiC wafer 10 and the bottom surface of the main container 20 having a temperature lower than that of the main surface 101 so as to face each other, the etching space X1 is formed between them. In this etching space X1, mass transportation occurs by using the temperature gradient formed by the heating furnace 30 as a driving force, and as a result, the SiC wafer 10 can be etched.

The etching temperature in the etching step S31 is preferably set in the range of 1400 to 2300° C., and more preferably set in the range of 1600 to 2000° C.

The etching rate in the etching step S31 can be controlled in the temperature range described above and can be selected in the range of 0.001 to 2 μm/min.

The etching amount in the etching step S31 is not particularly limited as long as the strain of the SiC substrate can be removed and the surface of the SiC substrate can be made to have a predetermined surface roughness or less.

Whether the strain of the SiC substrate is removed by the etching step S31 can be evaluated by the following method.

The strain of the SiC substrate (more specifically, the lattice strain) can be obtained by comparing the lattice with a reference crystal lattice as a reference. As a means of measuring this lattice strain, for example, the SEM-EBSD method can be used. The SEM-EBSD method is a method (Electron Back Scattering Diffraction (EBSD)) that enables strain measurement of minute regions on the basis of the Kikuchi line diffraction pattern obtained by electron backscattering in a scanning electron microscope (SEM). In this method, the amount of lattice strain can be obtained by comparing the diffraction pattern of the reference crystal lattice as a reference with the diffraction pattern of the measured crystal lattice.

As the reference crystal lattice, for example, a reference point is set in a region where lattice strain is not considered to occur. In general, it is a well-established theory that the depth of the subsurface damaged layer introduced by machining is about 10 μm. Therefore, it is sufficient that the reference point is set at a position of the depth of about 20 to 35 μm, which is considered to be sufficiently deeper than the subsurface damaged layer.

Next, the diffraction pattern of the crystal lattice at this reference point is compared with the diffraction pattern of the crystal lattice of each measurement region measured at a pitch on the order of nanometers. This makes it possible to calculate the amount of lattice strain in each measurement region with respect to the reference point.

The case where a reference point that is considered to have no lattice strain is set as the reference crystal lattice has been described. However, it is also possible to use an ideal crystal lattice of single crystal SiC as the reference, or use a crystal lattice that occupies the majority (for example, equal to or greater than a half) of the measurement region surface as the reference.

By measuring whether lattice strain exists by this SEM-EBSD method, the presence or absence of the subsurface damaged layer can be determined. That is, when subsurface damage such as a scratch, a latent scratch introduced by machining, and strain is introduced, lattice strain occurs in the SiC substrate, and stress is observed by the SEM-EBSD method.

The "predetermined surface roughness" of the SiC substrate to be achieved by the etching step S31 is, as arithmetic average roughness (Ra), preferably equal to or less than 60 nm, more preferably equal to or less than 50 nm, more preferably equal to or less than 40 nm, more preferably equal to or less than 30 nm, more preferably equal to or less than 20 nm, more preferably equal to or less than 10 nm, still more preferably equal to or less than 5 nm, still more preferably equal to or less than 4 nm, still more preferably equal to or less than 3 nm, and still more preferably equal to or less than 2 nm.

As described above, the etching amount is not particularly limited as long as it can remove the strain of the SiC substrate and achieve the surface roughness in the above-mentioned numerical range, but specifically, it is preferably equal to or greater than 0.5 μm, more preferably equal to or greater than 0.6 μm, more preferably equal to or greater than 0.7 μm, more preferably equal to or greater than 0.8 μm, more preferably equal to or greater than 0.9 μm, still more preferably equal to or greater than 1 μm, still more preferably equal to or greater than 2 μm, and still more preferably equal to or greater than 3 μm.

The etching time in the etching step S31 can be set to an arbitrary time so as to have a desired etching amount. For example, when the etching rate is 1 μm/min and the etching amount is set to 1 μm, the etching time is 1 minute.

The temperature gradient in the etching planarization step S31 is set in the range of 0.1 to 5° C./mm in the etching space X1.

<5> Step after Etching Step S31

The SiC wafer that has been subjected to the etching step S31 has reduced strain and has an extremely smooth surface.

Therefore, a mode can be adopted in which some kind of machining is not performed again after the etching step S31. Examples of machining include chemical mechanical polishing (CMP).

In machining including CMP, scratches and strain due to machining may occur on the surface of the SiC wafer to some extent. By not performing machining after the etching step S31, it is possible to provide a higher-quality SiC wafer.

In conventional methods, after performing a mirror polishing step S40 including a chemical mechanical polishing step S41, a cleaning step S52 is performed in order to remove fine particles remaining on the surface of the SiC wafer. RCA cleaning is generally used as a cleaning method (FIG. 11).

On the other hand, in the present invention in which strain removal and an extremely smooth surface are achieved by the etching step S31 instead of the mirror polishing step S40, residual foreign matter to be removed by the cleaning step S52 does not occur after the etching step S31. Therefore, it is not necessary to perform the cleaning step S52 after the etching step S31 (FIG. 1).

As described above, in the present invention, a SiC wafer having a surface that can be subjected to epitaxial growth can be obtained by the etching step S31.

Therefore, it is effective from the viewpoint of reducing man-hours to perform the epitaxial growth step S61 for forming an epi layer on the surface of the SiC wafer after the etching step S31.

Any known method can be adopted as the method of the epitaxial growth step S61 performed after the etching step S31.

For example, as means for epitaxial growth, a CVD method, a PVE method, or an LPE method can be used. Here, the CVD method refers to the chemical vapor deposition method, the PVE method refers to the physical vapor epitaxy method, and the LPE method refers to the liquid phase epitaxy method.

[Production Method of SiC Single Crystal Seed Substrate]

Figure 5:
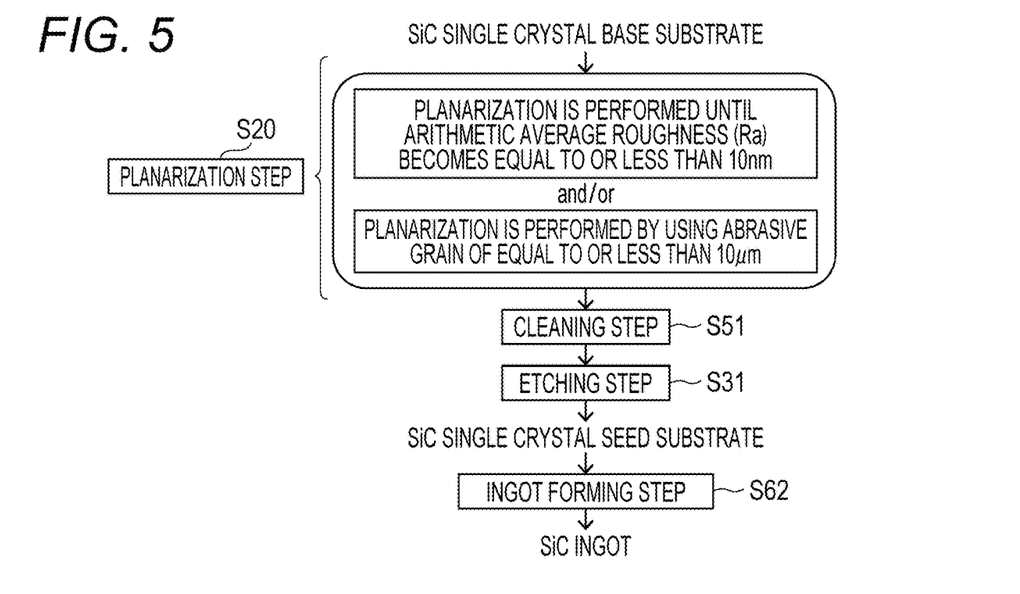
FIG. 5 is a schematic diagram illustrating an embodiment when the present invention is applied to manufacture of a SiC ingot.

The present invention can be applied to the production of a SiC single crystal seed substrate. FIG. 5 illustrates an embodiment when the present invention is applied to the production of a SiC single crystal seed substrate.

As illustrated in FIG. 5, in the present embodiment, regarding the SiC single crystal base substrate, after the planarization step S20 is performed until a predetermined surface roughness is obtained, or after a planarization step is performed using an abrasive grain having a predetermined grain size or less, an etching step S31 is performed.

As for the specific aspect of the planarization step S20 and the etching step S31, the above-mentioned description of the method for producing a SiC wafer is applicable.

The present embodiment includes an ingot forming step S62 of performing crystal growth of the SiC single crystal seed substrate obtained by the etching step S31 to obtain an ingot.

As a specific aspect of the ingot forming step S62, known ingot forming means can be adopted without particular limitation, and examples thereof include a sublimation method, a CVD method, and a gas growth method.

The SiC ingot thus obtained may be used as a raw material for the slicing step S1 to produce a SiC wafer according to the embodiment illustrated in FIG. 1.

Example

<1> Sample Preparation (Planarization Step)

A SiC substrate that was mirror-finished and had defects such as latent scratches removed was prepared.

Diamond abrasive grains with an average abrasive grain size of 15 μm, 10 μm, 1 μm, or 0.3 μm were used for this SiC substrate, and pseudo-planarization was performed by a fixed abrasive grain method to prepare samples 1 to 4.

The arithmetic average roughness (Ra) of samples 1 to 4 was measured. The arithmetic average roughness (Ra) was measured using a laser microscope for sample 1 and AFM for samples 2 to 4.

For samples 1 to 4, the average abrasive grain size and arithmetic average roughness (Ra) of the abrasive grains used for preparation are summarized in Table 1 below. For the arithmetic average roughness (Ra), the value rounded to the first decimal place is shown in the table.

TABLE 1

| Sample No. | 1 | 2 | 3 | 4 |
|---|---|---|---|---|
| Average grain abrasive size of used abrasive grain (μm) | 15 | 10 | 1 | 0.3 |
| Arithmetic average roughness (Ra) (nm) | 1100 | 53 | 17 | 1 |

<2> Etching Step

The main container 20, refractory container 40, and samples 1 to 4 (SiC wafer 10) as below were arranged so as to have the configurations illustrated in FIGS. 2 and 3.
[Main Container 20]
  Material: Polycrystalline SiC
  Container size: Diameter 60 mm×Height 4 mm
  Substrate holder 24 material: Single crystal SiC
  Distance between SiC wafer 10 and bottom surface of main container 20: 2 mm
[Refractory Container 40]
  Material: TaC
  Container size: Diameter 160 mm×Height 60 mm
  Si vapor supply source 44 (Si compound): TaSi$_2$
[Etching Step]

Samples 1 to 4 arranged under the above conditions were heat-treated under the conditions of a temperature gradient of 1° C./mm and a main heating chamber vacuum degree of $10^{-5}$ Pa.

For each sample, the test was conducted under two conditions: condition A in which a single crystal Si piece as a Si vapor supply source is arranged in the inside of the main container 20 and etching is performed, and condition B in which etching is performed without arranging a single crystal Si piece.

That is, condition A is a condition in which the SiC wafer 10 is arranged and heated in a semi-closed space having an atomic number ratio Si/C of greater than 1, and condition B is a condition in which the SiC wafer 10 is arranged and heated in a semi-closed space having an atomic number ratio Si/C of equal to or less than 1.

Etching was performed for each of heating temperatures of 1500° C., 1600° C., 1700° C., 1800° C. and 1900° C., under multiple conditions with different etching amounts. The etching amount can be adjusted by changing the heating time.

<3> Evaluation

<3-1> Measurement of Strain by SEM-EBSD Method

The strain existing in samples 1 to 4 before and after the etching step was observed by the SEM-EBSD method. The strain was measured by the SEM-EBSD method on the cleaved cross section of the SiC substrate of samples 1 to 4 under the following conditions using a scanning electron microscope.
  SEM device: Zeiss Merline
  EBSD analysis: OIM crystal orientation analyzer manufactured by TSL Solutions
  Acceleration voltage: 15 kV
  Probe current: 15 nA
  Step size: 200 nm
  Reference point R depth: 20 μm As a result of the measurement, strain was observed in samples 1 to 4 before the etching step. This is lattice strain introduced by the pseudo-planarization step performed in the sample preparation, and it can be seen that it has an subsurface damaged layer. In each case, compressive stress was observed. Specifically, strain of 5 μm in depth were observed in sample 1, 3 μm in depth in sample 3, and 1 μm in depth in sample 4.

On the other hand, no strain was observed in samples 1 to 4 after etching. This result indicates that the subsurface damaged layer was removed by the etching step.

Figure 6:
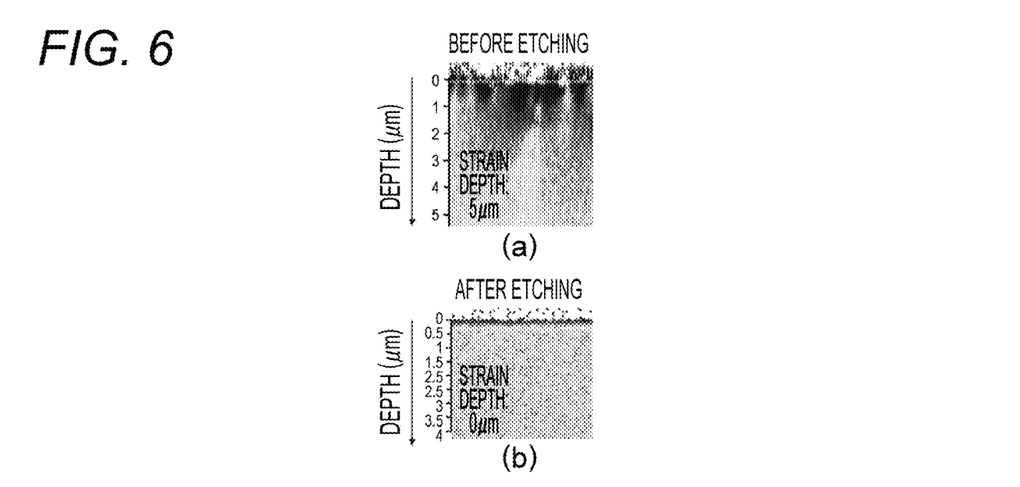
FIG. 6 is a cross-sectional SEM-EBSD captured image of sample 1 before and after etching in a test example.

FIG. 6 illustrates a cross-sectional SEM-EBSD captured image of the SiC substrate of sample 1 before and after etching. FIG. 6(*a*) is a cross-sectional SEM-EBSD captured image of sample 1 before etching. Before this etching, it can be seen that strain is introduced from the black-and-white contrast of the image to the position of a depth of 5 μm. FIG. 6(*b*) is a cross-sectional SEM-EBSD captured image after etching. After this etching, the black-and-white contrast as before the etching was not observed. That is, as illustrated in FIG. 6, strain having a depth of 5 μm was introduced before the etching step, but this could be removed by etching.

<3-2> Surface Evaluation by SEM

Figure 7:
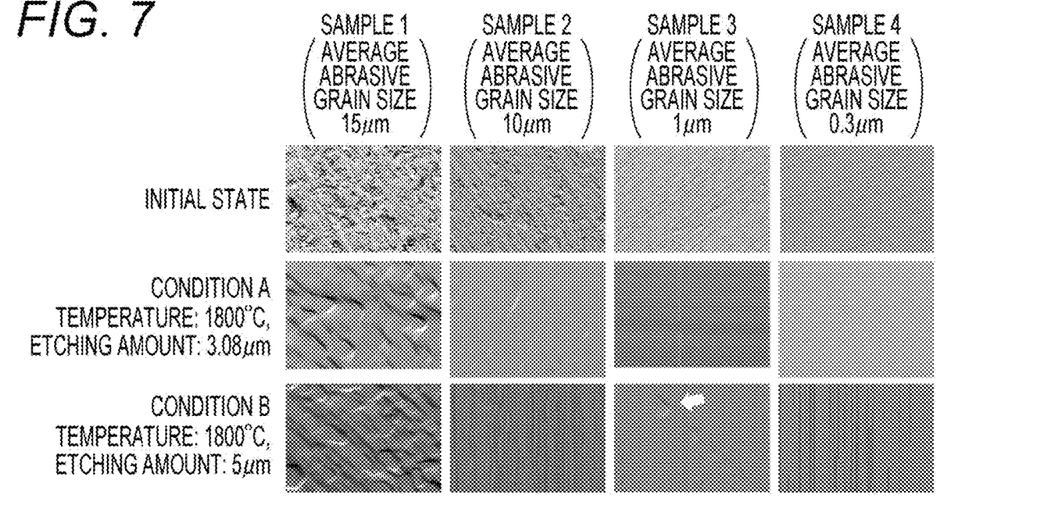
FIG. 7 illustrates SEM images of surfaces of samples 1 to 4 before and after etching in the test example (magnification 3000 times). The upper row is the initial state before etching, the middle row is the surface after etching under condition A, and the lower row is the surface after etching under condition B.

The surfaces of samples 1 to 4 before and after the etching step were observed by SEM. FIG. 7 illustrates SEM images (magnification 3000 times) of the surfaces of the SiC substrates of samples 1 to 4 before the etching step, after etching at 3.08 μm under condition A (temperature 1800° C.), and after etching at 5 μm under condition B (temperature 1800° C.)

As illustrated in FIG. 7, sample 1 had remarkable unevenness on the surface even after etching under any of the conditions A and B.

On the other hand, as illustrated in FIG. 7, in samples 2 to 4, an extremely smooth surface state could be achieved by etching, and no remarkable unevenness as in sample 1 was observed.

In sample 3, after etching under the condition B, a slight pit (the part indicated by the white arrow) was observed. However, in sample 4, no pit was observed even by etching under the condition B, and it was found that a smoother surface could be obtained.

<3-3> Relationship Between Arithmetic Average Roughness (Ra) and Etching Amount

The etching amount and the arithmetic average roughness (Ra) were measured for the SiC substrates of samples 1, 3 and 4 etched under the various conditions described above. The arithmetic average roughness (Ra) was measured using a laser microscope for sample 1 and AFM for samples 3 and 4. Arithmetic average roughness (Ra) and etching amount before and after etching were plotted on the graph.

Figure 8:
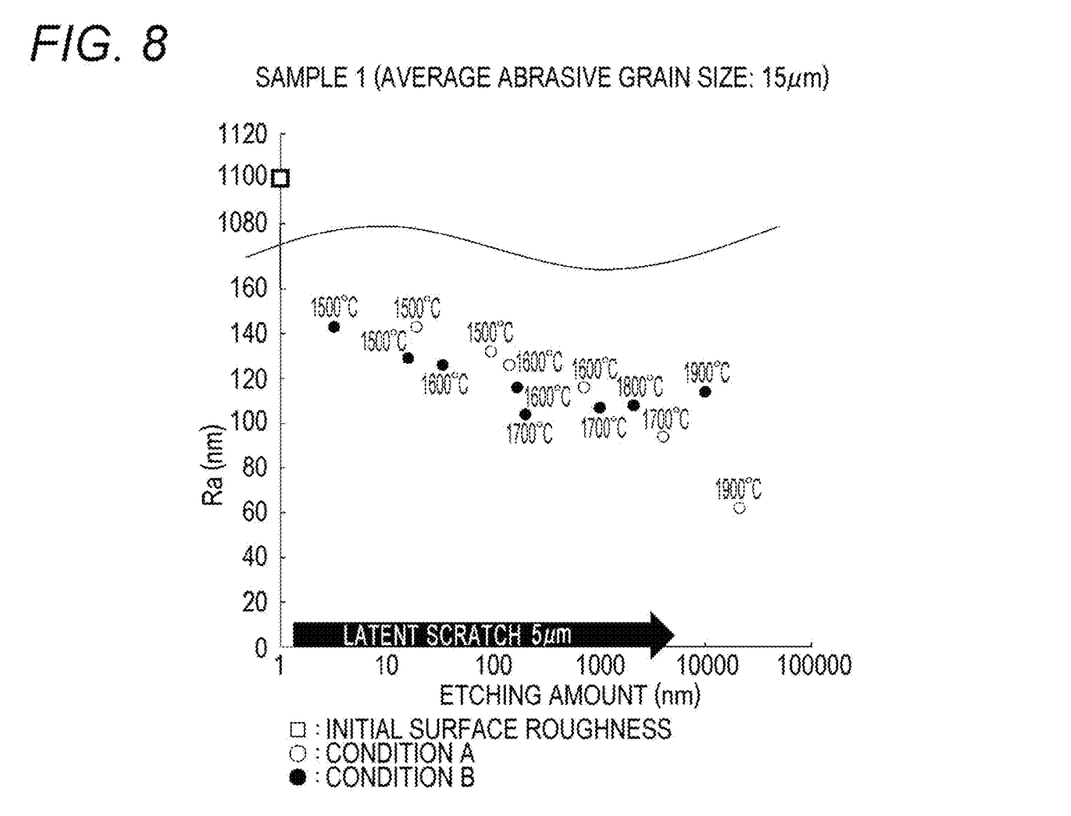
FIG. 8 is a graph illustrating results of sample 1 in a test example. The vertical axis indicates the arithmetic average roughness (Ra), and the horizontal axis indicates the etching amount. The temperature shown in the vicinity of each plot indicates the heating temperature in the etching step. The black arrows in the drawing indicate the depth of strain existing on the SiC substrate before etching.
Figure 9:
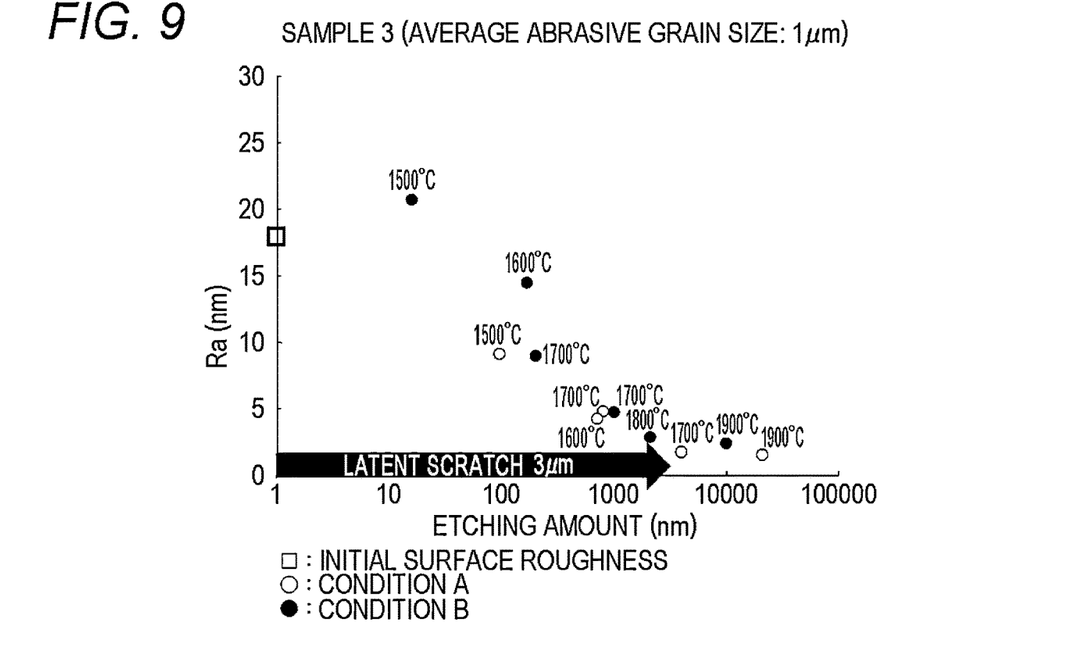
FIG. 9 is a graph illustrating results of sample 3 in a test example. The vertical axis indicates the arithmetic average roughness (Ra), and the horizontal axis indicates the etching amount. The temperature shown in the vicinity of each plot indicates the heating temperature in the etching step. The black arrows in the drawing indicate the depth of strain existing on the SiC substrate before etching.
Figure 10:
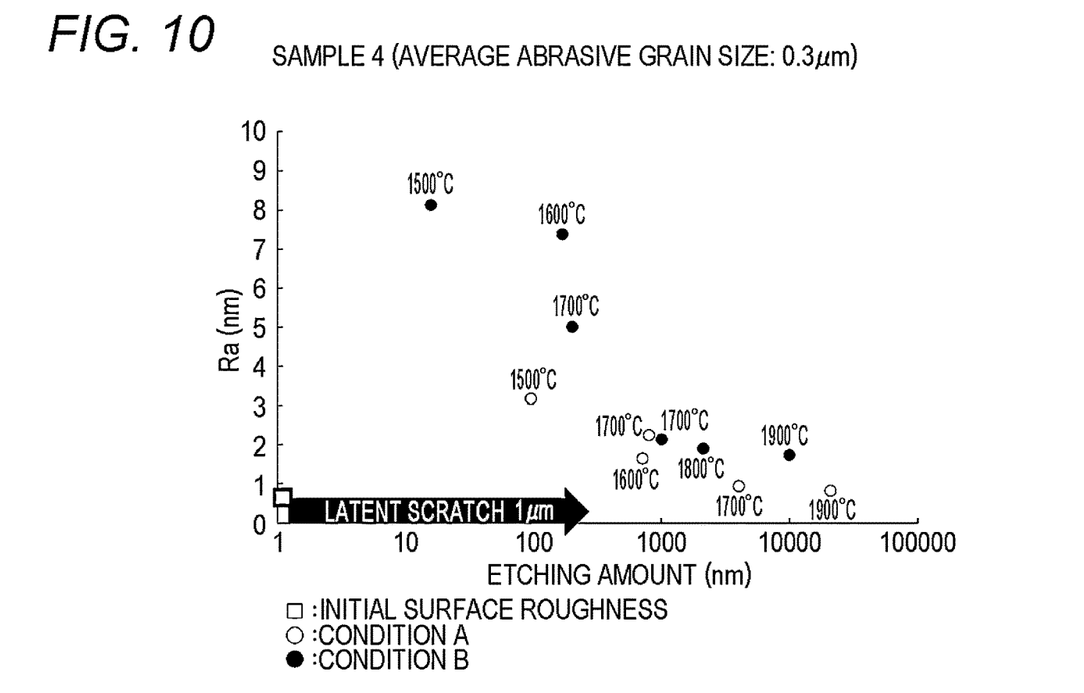
FIG. 10 is a graph illustrating results of sample 4 in a test example. The vertical axis indicates the arithmetic average roughness (Ra), and the horizontal axis indicates the etching amount. The temperature shown in the vicinity of each plot indicates the heating temperature in the etching step. The black arrows in the drawing indicate the depth of strain existing on the SiC substrate before etching.

The result of sample 1 is shown in FIG. 8, the result of sample 3 is shown in FIG. 9, and the result of sample 4 is shown in FIG. 10. In the graph showing each result, the depth of strain measured in <3-1> above is indicated by a black arrow.

As illustrated in FIG. 8, for the SiC substrate of sample 1 (initial arithmetic average roughness (Ra) is about 1100 nm) processed with an abrasive grain having an average abrasive grain size of 15 μm, even if deeply etched, the arithmetic average roughness (Ra) never fell below 60 nm. In particular, for the SiC substrate etched under condition B, even a region where the surface roughness increases as the etching amount increases was observed.

This result shows that, in the SiC substrate of sample 1, strain can be removed by etching, but an extremely smooth surface cannot be achieved.

On the other hand, for the SiC substrate of sample 3 (initial arithmetic average roughness (Ra) is about 17 nm) processed with an abrasive grain with an average abrasive grain size of 1 μm, the arithmetic average roughness (Ra) fell below 5 nm at an etching amount of around 1000 nm (FIG. 9).

Furthermore, it was found that the arithmetic average roughness (Ra) can be reduced to equal to or less than 2 nm by proceeding the etching beyond the depth of strain existing before etching (FIG. 9).

When the SiC substrate of sample 4 (initial arithmetic average roughness (Ra) is about 0.5 nm) processed with an abrasive grain with an average abrasive grain size of 0.3 μm was etched, it was confirmed that an extremely flat surface having the arithmetic average roughness (Ra) of equal to or less than 2 nm, further, equal to or less than 1 nm was formed (FIG. 10).

According to FIG. 8, in sample 1 which is the SiC wafer 10 having a crack, it can be seen that the etching rate of the condition B is higher than the etching rate of the condition A up to the 5 μm point where the subsurface damaged layer is removed.

Therefore, when etching the SiC wafer 10 having a crack, by including the step (condition B) of arranging and heating the SiC wafer 10 in a semi-closed space where the atomic number ratio Si/C is equal to or less than 1, etching can be performed at high speed.

Specifically, when the SiC wafer 10 having a crack is etched, the time of the etching step of the SiC wafer 10 can be shortened by first etching under the condition B and then etching under the condition A.

<4> Summary

The above results indicate that, it is possible to obtain a SiC substrate in which strain is removed and having an extremely smooth surface by performing the planarization step on a SiC substrate until the arithmetic average roughness (Ra) of the surface becomes equal to or less than 100 nm, or performing the planarization step by using an abrasive grain with an average abrasive grain size of equal to or less than 10 μm, and then performing etching in an atmosphere containing Si element and C element. The SiC substrate thus obtained can be subjected to an epitaxial growth step without further machining such as CMP.

REFERENCE SIGNS LIST

10 SiC substrate (SiC wafer)
101 Main surface
11 Subsurface damaged layer
111 Crack layer
112 Strain layer
12 Bulk layer
20 Main container
24 Substrate holder
30 Heating furnace
40 Refractory container
44 Si vapor supply source
X1 Etching space
S1 Slicing step
S20 planarization step
S21 Lapping step
S22 Rough grinding step
S23 Finish grinding step
S31 Etching step
S40 Mirror polishing step
S41 Chemical mechanical polishing step
S51, S52 Cleaning step
S61 Epitaxial growth step
S62 Ingot forming step

The invention claimed is:

1. A method for producing a SiC substrate, the method comprising an etching step of arranging a SiC substrate having arithmetic average roughness (Ra) of a surface of equal to or less than 100 nm in a main container made of SiC configured to act as a SiC material, and etching the SiC substrate in an atmosphere containing Si element and C element,
   wherein the etching step includes a step of arranging the SiC substrate and the main container or another SiC material so as to face each other, and performing heating so as to form a temperature gradient where the SiC substrate is high temperature side and the SiC container or another SiC material is low temperature side to etch the SiC substrate.

2. The method for producing a SiC substrate according to claim 1, wherein the SiC substrate having arithmetic average roughness (Ra) of the surface of equal to or less than 2 nm.

3. The method for producing a SiC substrate according to claim 1, the method including: a planarization step of planarizing the surface of the SiC substrate so that arithmetic average roughness (Ra) is equal to or less than 100 nm.

4. The method for producing a SiC substrate according to claim 3, wherein, in the planarization step, the surface of the SiC substrate is flattened so that the arithmetic average roughness (Ra) is equal to or less than 2 nm.

5. The method for producing a SiC substrate according to claim 3, wherein the planarization step of planarizing the surface of the SiC substrate comprises using an abrasive grain having an average abrasive grain size of equal to or less than 10 μm.

6. The method for producing a SiC substrate according to claim 5, wherein the average abrasive grain size of the abrasive grain is equal to or less than 0.5 μm.

7. The method for producing a SiC substrate according to claim 6, wherein the etching step includes a step of arranging and heating the SiC substrate in which a crack is introduced in a space of the main container made of SiC, wherein the space where has an atomic number ratio of Si/C of equal to or less than 1.

8. The method for producing a SiC substrate according to claim 6, wherein the etching step is a step of etching a SiC single crystal raw substrate to produce a SiC single crystal seed substrate, and the method further comprises an ingot forming step of performing crystal growth of the SiC single crystal seed substrate to obtain an ingot, after the etching step.

9. The method for producing a SiC substrate according to claim 6, wherein a diameter of the SiC substrate is equal to or greater than two inches.

10. The method for producing a SiC substrate according to claim 1, wherein the surface of the SiC substrate is not machined after the etching step.

11. The method for producing a SiC substrate according to claim 1, wherein a cleaning step is not performed after the etching step.

12. The method for producing a SiC substrate according to claim 1, wherein an epitaxial growth step of forming an epi layer on the surface of the SiC substrate is performed after the etching step.

\* \* \* \* \*